United States Patent [19]

Morishige

[11] Patent Number: 4,711,790
[45] Date of Patent: Dec. 8, 1987

[54] OPTICAL CVD METHOD WITH A STRONG OPTICAL INTENSITY USED DURING AN INITIAL PERIOD AND DEVICE THEREFOR

[75] Inventor: Yukio Morishige, Tokyo, Japan

[73] Assignee: NEC Corporation, Tokyo, Japan

[21] Appl. No.: 886,125

[22] Filed: Jul. 16, 1986

[30] Foreign Application Priority Data

Jul. 17, 1985 [JP] Japan ............................ 60-155962
Jul. 17, 1985 [JP] Japan ............................ 60-155963
Mar. 7, 1986 [JP] Japan ............................ 61-49616

[51] Int. Cl.$^4$ ............................................. B05D 3/06
[52] U.S. Cl. ..................................... 427/10; 118/50.1; 118/620; 118/666; 427/53.1; 427/54.1
[58] Field of Search ................... 427/53.1, 54.1, 10; 118/50.1, 666, 620, 641, 642; 204/157.15, 157.41

[56] References Cited

U.S. PATENT DOCUMENTS 4,612,085  9/1986  Jelks et al. ..................... 118/728

FOREIGN PATENT DOCUMENTS 60-128265  7/1985  Japan .................................. 118/728
61-030028  2/1986  Japan .................................. 427/53.1

OTHER PUBLICATIONS

Andreatta et al., "Appl. Phys. Lett." vol. 40, No. 2 (15 Jan., 1982) pp. 183–185.

*Primary Examiner*—John H. Newsome
*Attorney, Agent, or Firm*—Sughrue, Mion, Zinn, Macpeak & Seas

[57] ABSTRACT

In an optical system (19) of an optical CVD device, a variable optical attenuator (25) for a pulsed optical beam is controlled in two steps by a control unit (28) to make the optical beam have an optical intensity at a predetermined area of a substrate (11) in a first intensity range and then in a second intensity range which is an intensity range ordinarily used in depositing a CVD film on the predetermined area. The first intensity range should be very high to clean the substrate at the predetermined area without damages to the substrate. When the CVD film should be deposited to a thickness of one micron or thicker, the optical intensity is preferably varied to a third intensity range after the CVD film grows so that a peak temperature of the CVD film falls as a result of an increase in the heat capacity of the CVD film being grown. The third intensity range should be higher than the second intensity range and lower than an intensity at which the CVD film evaporates while being grown. Summarizing, the optical intensity is controlled during deposition of the CVD film to a range determined by the thickness of the CVD film being grown.

9 Claims, 4 Drawing Figures

OPTICAL CVD METHOD WITH A STRONG OPTICAL INTENSITY USED DURING AN INITIAL PERIOD AND DEVICE THEREFOR

BACKGROUND OF THE INVENTION

This invention relates to an optical CVD (chemical vapor deposition) method for use in depositing a thin film on a substrate as a CVD film and to an optical CVD device for use in carrying out the method. The thin film has usually a thickness of the order of a micron in the manner known in the art.

Various optical CVD methods are extensively studied and developed in recent years as processes for manufacturing semiconductor devices. For example, the optical CVD method is used in forming electrodes and wirings on integrated circuits, forming photolithographic masks on wafers, and doping wafers with impurities. This is because the optical CVD method lowers the temperature of the process and shortens the progress of work.

On carrying out the optical CVD method, a CVD gas or vapor is photo-induced, namely, subjected to photochemical reaction. The CVD gas comprises a material which should be deposited as the CVD film on a predetermined area of a substrate. A pulsed ultraviolet beam is used as an optical beam in subjecting the CVD gas to the photochemical reaction through an optical system. The pulsed ultraviolet beam is preferred because of the capability of heating the substrate to a raised temperature with the temperature rise locallized to the predetermined area either when the substrate is thermally insulating or when the predetermined area is an area of thermally insulative layer formed on the substrate. The pulsed ultraviolet beam is consequently capable of forming a fine pattern directly on the substrate when given pertinent characteristics. For use in generating such a pulsed ultraviolet beam, an optical source may be an excimer laser or a fourth harmonic producing system comprising an Nd:YAG laser.

A paper was contributed by H. Yokoyama et al of NEC Corporation, the present assignee, to "Technical Digest" of "CLEO '84" (Conference on Lasers and Electro-Optics held June 19 to 22, 1984), pages 222 to 223 and 225, as Paper No. FD6 of the title of "Importance of Photo-induced Surface Heating for Film Quality Improvement in Excimer Laser-Induced Metal CVD." According to the Yokoyama et al paper, a KrF excimer laser is used as an optical source of the pulsed ultraviolet beam. With chromium hexacarbonyl vapor used as the CVD gas, a chromium film is deposited as the CVD film on a glass substrate. It is clarified that a photothermal or photo-heating effect is important in achieving a smooth film surface and a tenacious adhesion strength.

A paper was submitted by Yukio Morishige, the present applicant, et al in the Japanese language together with a summary in English to "Proceedings of the 27th Symposium on Semiconductors and Integrated Circuits Technology" of Electronic Materials Committee of the Electrochemical Society of Japan, held in Tokyo on Dec. 4 and 5, 1984, pages 6 to 11, under the title of "Micrometer-Scale Cr Film CVD with kHz Repetition Rate UV Light Pulses" according to the summary. In the Morishige et al paper, a kHz repetition fourth harmonic ultraviolet beam of a Q-switched Nd:YAG laser is used as the optical beam in depositing a chromium film on a quartz substrate from a CVD gas of chromium hexacarbonyl vapor. It has been demonstrated that the chromium film broadens only about one micron from the predetermined area of 12 microns square and that the CVD method is very attractive for an application in repairing a photomask pinhole defect. These facts are further proved by simulation for broadening of the area which is subjected to the photothermal effect. Incidentally, an optical attenuator was used in an experimental setup in studying relationships between an optical intensity of the optical beam at the predetermined area and the film quality which the chromium film has at its surface.

An article was contributed by H. Yokoyama, named above, et al to Applied Physics, Volume A 37 (1985), pages 25 to 30, under the title of "Photothermal Effect Contribution on Film Quality Improvement in Excimer-Laser Induced Metal CVD." A KrF excimer laser is used as the optical source of the pulsed ultraviolet beam in depositing a chromium film on a quartz substrate with chromium hexacarbonyl vapor used as the CVD gas. A variable attenuator was used in making the optical beam have various optical intensities to study the effects which the optical intensity causes on surface morphology and adhesion.

In the above-referenced papers and article, the substrate is held in a reaction or CVD cell. The CVD gas is supplied through the reaction cell by a gas supplying system. The pulsed optical beam is given a constant average intensity, which is selected to attain an optimum irradiating condition. It is already known that such a CVD film is depthwise heterogeneous in composition and is not sufficiently strongly adhesive to the substrate.

An optical CVD method is revealed in Japanese Patent Prepublication (Publication of Unexamined Patent Application) No. 197,560 of 1984 for an application filed by NEC Corporation, assignee from Hiroyuki Yokoyama, the sole inventor. According to the method, the adhesion is strengthened by irradiating the predetermined area of the substrate in vacuum by a very strong laser beam immediately before deposition of the CVD film. An expensive optical CVD device is, however, indispensable on carrying out the method when the substrate is of quartz or of a like material which is transparent to electromagnetic waves of a wide wavelength region. This is because the laser beam must have a limited wavelength which can effectively be absorbed by the substrate. The optical source and the optical system therefore becomes expensive.

Another optical CVD method is disclosed in Japanese Patent Prepublication No. 208,065 of 1984 for an application filed by NEC Corporation, assignee from Hiroyuki Yokoyama, the inventor. According to the method, the adhesion is intensified by irradiating the substrate with a laser beam superposed on the pulsed ultraviolet beam. The laser beam should have a wavelength in the visible or an infrared wavelength region and a sufficiently high intensity within an intensity range in which the laser beam would not subject the CVD gas to thermal dissociation. It has, however, been confirmed that the adhesion is not much improved. More particularly, the CVD film readily peals off when subjected to a scratch test by a pair of tweezers. This is because a restriction is unavoidably imposed on the temperature rise so that the substrate surface is only insufficiently cleaned.

Still another optical CVD method is revealed in Japanese Patent Prepublication No. 209,642 of 1984 for an application filed by NEC Corporation, assignee from Kunihiko Washio, the inventor. The adhesion is augmented by surface etching the substrate by gas discharge in an inactive gas. Devices are therefore necessary for the gas discharge. This renders the optical CVD device bulky and expensive.

Yet another optical CVD method is disclosed in Japanese Patent Prepublication No. 53,015 of 1985 for an application filed by NEC Corporation, assignee from Hiroyuki Yokoyama, the inventor. The adhesion is reinforced by irradiating the CVD film with a laser beam after removal of the CVD gas from the reaction cell. It appears according to Yokoyama that the CVD film is physically adsorbed by the substrate when deposited and that a chemical bond occurs between the CVD film and the substrate during irradiation by the laser beam. It has, however, been found that hydrocarbons and other impurities are inevitably included in the CVD film during an initial period of deposition and that such impurities would vaporize during the laser beam irradiation to weaken the CVD film.

It would be worthwhile to point out here the fact that the methods proposed in the above-referenced patent prepublications are incapable of rendering the composition of the CVD film depthwise homogeneous. The adhesion is strengthened, if possible, either by an expensive optical CVD device or by accompanying defects. Furthermore, the adhesion depends on degrees to which the substrate is cleaned at least at its surface before subjected to the optical CVD method. In other words, the conventional optical CVD methods are defective in reproducibility and reliability.

SUMMARY OF THE INVENTION

It is therefore an object of the present invention to provide an optical CVD method capable of depositing a CVD film which tenaciously adheres to a substrate.

It is another object of this invention to provide an optical CVD method of the type described, capable of making the CVD film have a depthwise homogeneous composition.

It is still another object of this invention to provide an optical CVD method of the type described, capable of forming a CVD film which has no defects.

It is yet another object of this invention to provide an optical CVD method of the type described, which is highly reproducible and reliable.

It is a further object of this invention to provide an optical CVD device for use in carrying out the optical CVD method of the type described.

Other objects of this invention will become clear as the description proceeds.

According to this invention, there is provided a method of depositing a thin film on a predetermined area of a substrate exposed to a gas susceptible of photochemical reaction, which method includes the step of irradiating the area by a pulsed optical beam of an optical intensity and which method is characterised by the step of controlling the intensity during deposition of the film to a range determined by a thickness to which the film is deposited.

According to this invention, there is also provided a device for use in depositing a thin film on a predetermined area of a substrate, which device includes a reaction cell having a window and comprising means for holding the substrate, an optical source of a pulsed optical beam, an optical system for leading the optical beam to the predetermined area through the window, a gas supplying system for supplying a gas into the reaction cell to place the substrate in an atmosphere of the gas, the gas being susceptible of photochemical reaction when irradiated by the optical beam, and which device is characterised in that the optical system comprises a variable optical attenuator for giving a controllable attenuation to the optical beam so that an attenuated beam of an attenuated intensity be led to the predetermined area and that the gas be irradiated by the attenuated beam, which device comprising a control unit for controlling the controllable attenuation during deposition of the film to a range determined by a thickness to which the film is deposited.

In connection with the optical CVD device according to this invention, attention should be directed to the variable optical attenuator having the controllable attenuation. A variable attenuator is used also in the optical CVD devices which are used in the Morishige et al paper referenced heretobefore and in some of the Japanese patent prepublications referred to hereinabove. In contrast to the variable attenuators used in prior art, the variable optical attenuator has a controllable attenuation which is positively controlled according to this invention during deposition of each thin or CVD film.

DESCRIPTION OF THE PREFERRED EMBODIMENTS

Figure 1:
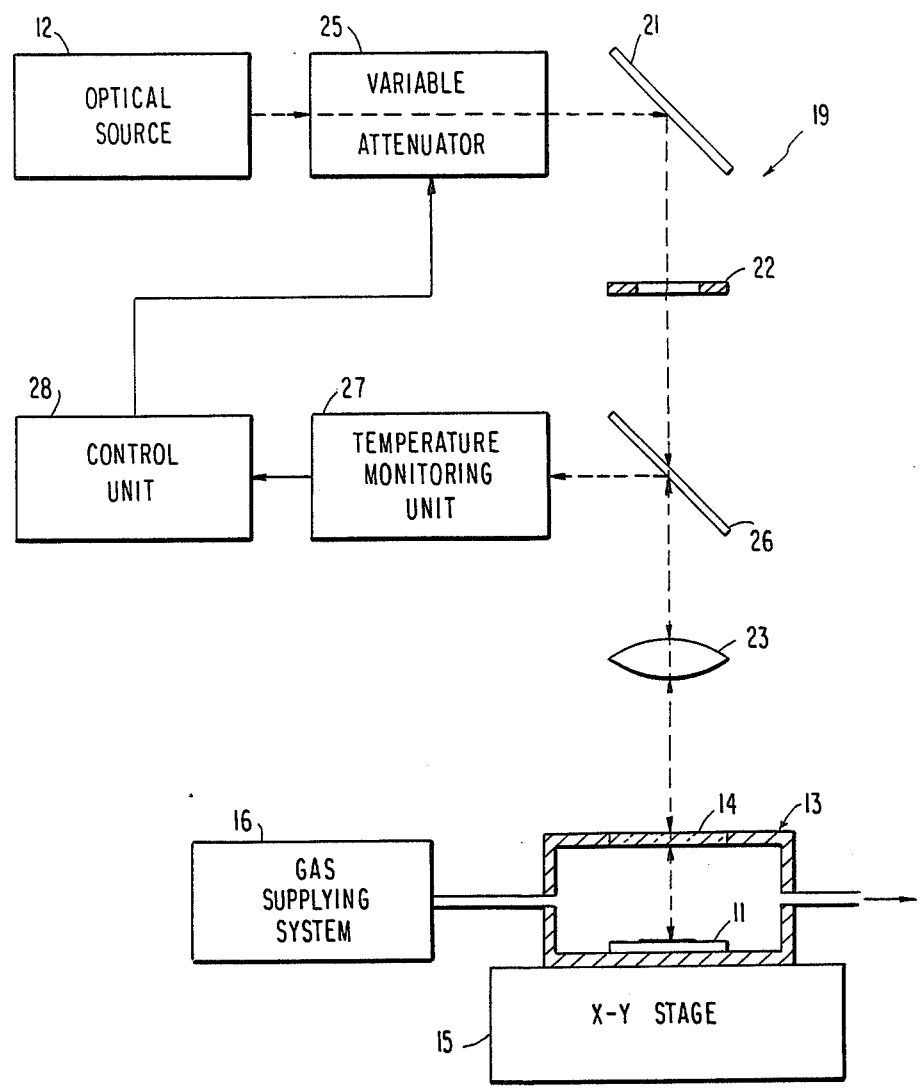
FIG. 1 is a schematic side view of an optical CVD device according to a first embodiment of the instant invention.

Referring to FIG. 1, an optical CVD (chemical vapor deposition) device has a structure according to a first embodiment of one aspect of the present invention and is for use in carrying out an optical CVD method according to a first embodiment of another aspect of this invention. The optical CVD device is for use in depositing a thin or CVD film on a predetermined area of a substrate 11. The CVD film is schematically depicted by a short thick line. In the manner which will presently be described more in detail, the substrate 11 is placed in an atmosphere of a CVD gas or vapor from which the CVD film is deposited on the predetermined area.

The optical CVD device comprises an optical source 12 of pulsed light of a known pulse repetition rate or period. The pulsed light is led to the predetermined area as a pulsed optical beam to subject the CVD gas to photochemical reaction or dissociation. Preferably, the pulsed optical beam is a pulsed ultraviolet beam which is either generated by a KrF excimer laser or consists of fourth higher harmonics of a laser beam generated by an Nd:YAG laser. The substrate 11 is held in a reaction or CVD cell 13 in the known manner. The reaction cell 13 has a window 14 which is transparent to the pulsed optical beam. The reaction cell 13 is carried by an X-Y stage 15 for two-dimensionally moving the reaction cell 13 together with the substrate 11. This makes it possible to select the predetermined area optionally on the substrate 11.

A gas supplying system 16 is for causing the CVD gas to flow through the reaction cell 13 at a desired flow rate known in the art. After subjected to the photochemical reaction, the CVD gas is led out of the reaction cell 13 and is rendered harmless by a gas disposing unit which is symbollycally indicated by an arrow.

An optical system 19 is interposed between the optical source 12 and the reaction cell 13 to shape the pulsed optical beam. Ordinarily, the optical system 19 comprises a mirror 21 for sideway directing the pulsed optical beam, a slit 22 for shaping the pulsed optical beam, and a lens 23 for focussing the pulsed optical beam on the predetermined area through the window 14. In cooperation with the lens 23, the slit 22 defines the predetermined area on the substrate 11.

Between the optical source 12 and the mirror 21, the optical system 19 comprises a variable optical attenuator 25 for giving a controllable attenuation to the pulsed optical beam so that an attenuated beam of an attenuated intensity be led to the predetermined area and that the CVD gas be irradiated by the attenuated beam. A beam splitter 26 is interposed between the slit 22 and the lens 23 and has a known coating which is substantially transparent to the attenuated beam and reflects an infrared beam which will shortly be described.

When the attenuated beam is incident on the predetermined area, the substrate 11 is heated locally at the predetermined area in the manner described in detail in the Morishige et al paper cited heretobefore. The CVD gas is susceptible not only of the photochemical reaction but also of photothermal reaction, which plays an important role in improving the qualities which the CVD film has. Inasmuch as the attenuated beam is pulsed, the substrate 11 has a varying temperature at the predetermined area. As will later be exemplified, the varying temperature rises to a peak temperature which is as high as above 500° C. The CVD film therefore emits infrared rays which are shaped by the lens 23 into the above-mentioned infrared beam. The lens 23 and the window 14 should be transparent not only to the pulsed ultraviolat beam but also to the infrared beam. For this purpose, the lens 23 and the window 14 may be of quartz.

The optical CVD device comprises a temperature monitoring unit 27 which receives the infrared beam from the beam splitter 26 and produces an output electric signal representative of the varying temperature. Supplied with the electric signal, a control unit 28 detects a peak value which the electric signal has in each cycle of the pulse repetition period. The peak value corresponds to the above-described peak temperature. The control unit 28 supplies the variable optical attenuator 25 with a control signal dependent on the peak value. Throughout deposition of the CVD film, the control signal controls the controllable attenuation so that the attenuated intensity be in an intensity range determined by a thickness to which the CVD film is deposited or grown.

In this manner, a combination of the temperature monitoring and the control units 27 and 28 serves as a feedback loop for the variable optical attenuator 25. It is now understood that the optical CVD method is characterised by the step of controlling the optical intensity of the pulsed optical beam during deposition of the CVD film to the intensity range described above. The optical CVD device is characterised by the variable optical attenuator 25 and a controlling arrangement comprising the temperature monitoring and the control units 27 and 28 for controlling the controllable attenuation during deposition of the CVD film to an attenuation range determined by a thickness to which the CVD film is deposited or grown.

In comparison with the method and the device according to this invention, description will be given as regards a conventional optical CVD method by which a chromium film is deposited as the CVD film on a predetermined area of a quartz substrate from chromium hexacarbonyl vapor which is used as the CVD gas and is irradiated by a pulsed ultraviolet beam. The quartz substrate is transparent to the electromagnetic waves of a wavelength region between about 0.2 micron and 2.3 microns and therefore to the pulsed ultraviolet beam. In other words, the substrate does not absorb the pulsed ultraviolet beam and, as a consequence, is not directly heated by the pulsed ultraviolet beam. Inasmuch as the conventional optical CVD method is in consideration, the pulsed ultraviolet beam has a constant average intensity throughout deposition of the CVD film.

During an initial period of deposition of the CVD film, the pulsed ultraviolet beam is absorbed by the CVD gas adsorbed at the pretetermined area of the substrate and the CVD gas which surrounds the predetermined area in the vapor phase. Throughout the initial period, the temperature scarcely rises even at the predetermined area. The CVD film therefore grows on the predetermined area mainly as a result of the photochemical reaction caused to the CVD gas by the pulsed ultraviolet beam. A part of the carbonyl radicals may dissociate into hydrocarbons and like impurities which are deposited in the growing CVD film. The CVD film therefore has an inferior film quality and only poorly adheres to the substrate. Furthermore, the impurities may vaporize during deposition of the CVD film to further deteriorate the film quality.

When the CVD film grows to a thickness capable of absorbing the pulsed ultraviolet beam, the temperature rises in a zigzag manner with the pulse repetition rate. The CVD film has a peak temperature which monotonously rises as the CVD film grows thicker to a threshold thickness as will shortly be discussed in detail. The photothermal effect improves the film quality. The CVD film, however, partly evaporates when the peak temperature excessively rises. The peak temperature should therefore be restricted below an upper limit at which the evaporation takes place.

The peak temperature becomes highest when the CVD film grows to the above-mentioned threshold thickness which is of the order of the wavelength of the pulsed ultraviolet beam. This is because the CVD film has a heat capacity which increases with an increase in the thickness. After reaching the highest value, the peak temperature begins to fall. Consequently, the film quality is again deteriorated after the CVD film grows to the threshold thickness. In fact, the CVD film has a rough surface when grown thicker than about one micron. The surface roughness is like that shown by scanning electron microscope photographs in the above-cited Yokoyama et al paper for different optical intensities of the pulsed ultraviolet beam.

In marked contrast to the conventional optical CVD method, the optical or the attenuated intensity is set in a high intensity range during the initial period according to this invention. The high intensity range should be such as not to damage the substrate. This serves to clean the predetermined area and thereby augment the adhesion of the CVD film to the substrate. This furthermore serves to raise the temperature of the predetermined area or CVD film to improve the film quality near the substrate. The optical intensity is subsequently reduced to a relatively low intensity range in which the CVD film would not evaporate during deposition. If the CVD film should be deposited to a thickness which makes the peak temperature gradually fall as a result of an increase in the heat capacity of the CVD film, the optical intensity is raised to a relatively high intensity range in which the CVD film will not evaporate. This gives the CVD film a depthwise homogeneous composition in cooperation with the optical intensity of the high intensity range during the initial period.

In this manner, the CVD film tenaciously adheres to the substrate, is given a depthwise homogeneous composition and therefore an excellent film quality, and has a smooth surface of metallic luster even when the CVD film is grown to a thickness of one micron or thicker. It should clearly be noted that these intensity ranges are for keeping the peak temperature of the CVD film substantially constant throughout deposition of the CVD film and that the substantially constant peak temperature should not exceed the temperature at which the CVD film evaporates. In other words, the peak temperature should be kept in a temperature range between a temperature of evaporation of the CVD film and a temperature at which the CVD film either has an objectionable film quality or a rough surface.

When a chromium film should be deposited as the CVD film from chromium hexacarbonyl vapor used as the CVD gas, the temperature of the CVD film should be kept in an optimum temperature range between about 800° C. and 1200° C. throughout deposition of the CVD film. The optical source 12 may be a Q-switched Nd:YAG laser for fourth higher harmonics. The chromium hexacarbonyl vapor may have a partial pressure of about torr in a carrier or buffer gas of argon of one atmospheric pressure. When the temperature is below about 800° C., the CVD film has a rough surface. When the temperature is above about 1200° C., a hole appears at a portion of the CVD film as a result of evaporation.

By way of example, the attenuated intensity may be equal to a first constant intensity of 10 MW/cm$^2$ at the predetermined area of the substrate throughout the initial period which may be five seconds long. The attenuated intensity may be equal to a second constant intensity of 2.0 MW/cm$^2$ after lapse of the initial period. The attenuated intensity may be kept at the second constant intensity during five seconds, namely, until lapse of ten seconds after start of deposition of the CVD film. Thereafter, the attenuated intensity should be intensified to a somewhat higher intensity. Inasmuch as the chromium film evaporates when the attenuated intensity exceeds 3 MW/cm$^2$, the somewhat higher intensity may be a third constant intensity of 2.5 MW/cm$^2$. When a chromium film was deposited in this manner to a thickness of 0.3 micron, the CVD film had an excellent depthwise homogeneity in composition and was tenaciously adhesive to the substrate even with no preliminary cleaning so that the CVD film did not peal off the substrate when subjected to a scratch test by a pair of tweezers.

Figure 2:
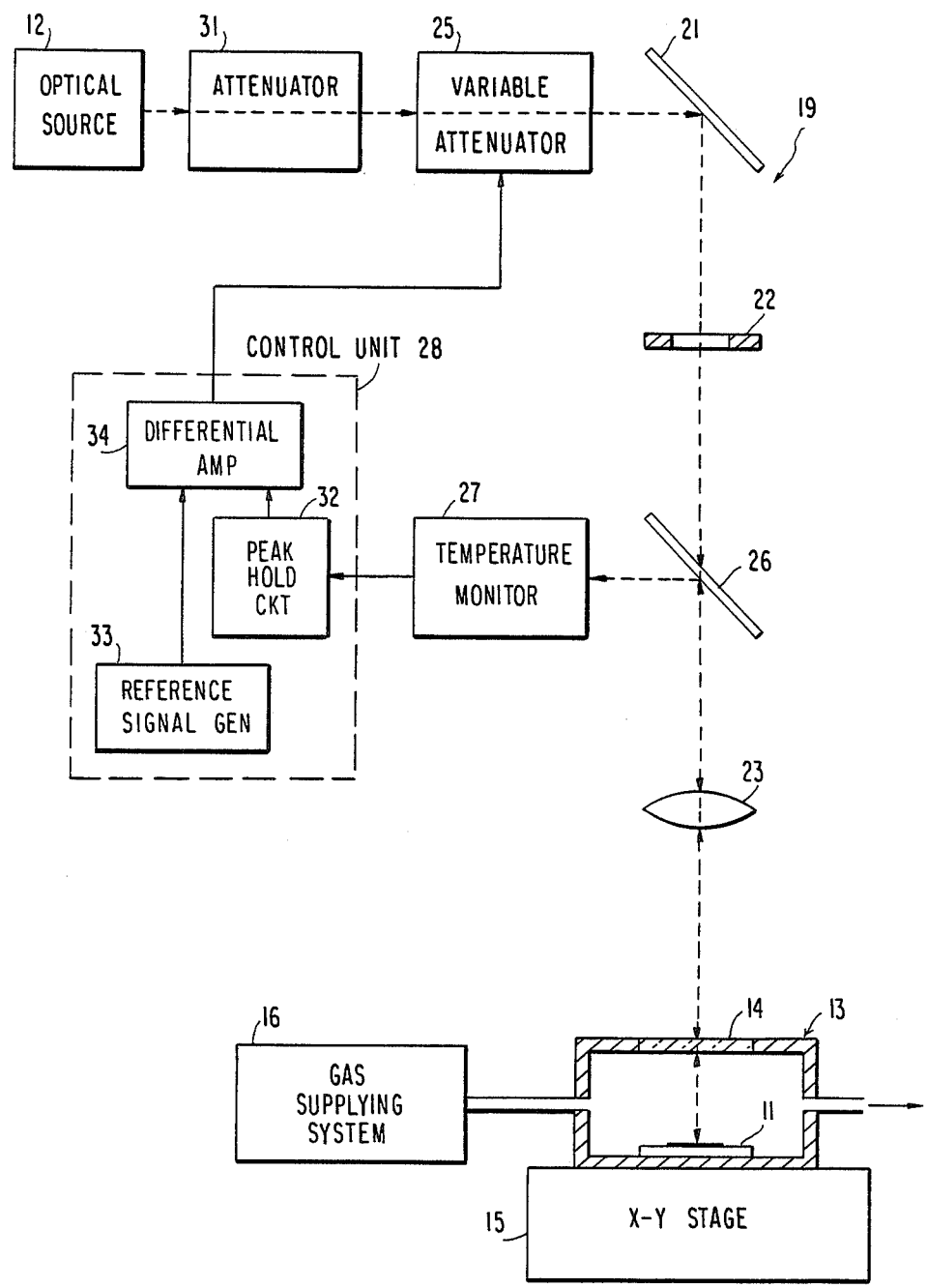
FIG. 2 is a schematic side view of an optical CVD device according to a second embodiment of this invention.

Referring now to FIG. 2, an optical CVD device has a structure according to a second embodiment of the above-mentioned one aspect of this invention and is for use in carrying out an optical CVD method according to a second embodiment of the other aspect of this invention. In FIG. 2, the device comprises similar parts designated by like reference numerals. The device is capable of forming molybdenum wirings as CVD films on an integrated circuit used as a substrate which is designated again by the reference numeral 11. It should be noted that such wirings should have a relatively thick thickness of about one micron and a low resistivity which can be achieved only by an excellent film quality.

In FIG. 2, the optical system 19 comprises a fixed optical attenuator 31 between the optical source 12 and the variable optical attenuator 25. The fixed optical attenuator 31 gives a constant attenuation to the pulsed optical beam to keep the optical intensity at the predetermined area of the substrate 11 below a threshold intensity of causing damages to the substrate 11. The fixed optical attenuator 31 is used because the attenuated intensity of the attenuated beam might be so strong as to cause damages to the substrate 11 during the initial period of deposition of the CVD film. When the attenuated intensity is always below the threshold intensity, the fixed optical attenuator 31 may be dispensed with.

The control unit 28 comprises a peak hold circuit 32 for use in holding a peak value which the output electric signal of the temperature monitoring unit 27 has during each cycle of the pulse repetition period. The peak value corresponds to the peak temperature of the CVD film. The peak hold circuit 32 produces a peak value signal representative of the peak value from time to time. A reference signal generator 33 is for generating a reference signal representative of a reference temperature for the CVD film. Responsive to the peak value signal and the reference signal, a diferential amplifier 34 produces the above-described control signal.

It is possible to understand that the peak hold circuit 32 serves as a peak detecting circuit for detecting a peak value of the output electric signal of the temperature monitoring unit 27 to produce a peak signal representative of the peak value. A combination of the reference signal generator 33 and the differential amplifier 34 serves as a difference calculator responsive to the peak signal for calculating a difference between the peak value and a reference value. Through a connection between the difference calculator and the variable optical attenuator 25, the difference is used in controlling the controllable attenuation to the optimum attenuation range defined by the reference value. The peak temperature of the CVD film is thereby kept in the optimum temperature range specified by the reference value.

The substrate may be a silicon substrate covered with a 2-micron thick silicon dioxide layer. The CVD gas may be molybdenum hexacarbonyl vapor of a partial pressure of five torrs in argon buffer gas of one atmospheric pressure. The pulsed optical beam may consist of fourth higher harmonics generated by a Q-switched Nd:YAG laser and have a pulse repetition rate of 2 kHz.

A molybdenum film was deposited in 20 seconds on a predetermined area which was 2 microns by 100 microns wide. Throughout the deposition, the peak temperature was successfully kept in an optimum temperature range between about 500° C. and 1500° C. The attenuated intensity was 10 MW/cm$^2$ during the initial period of 5 seconds and then reduced to 2.0 MW/cm$^2$ until lapse of 15 seconds from start of the deposition. The attenuated intensity was thereafter increased to 3.0 MW/cm$^2$ at which evaporation of the CVD film did not take place. The molybdenum film was deposited to a thickness of 1 micron and found to be tenaciously adhesive to the substrate and have a depthwise homogeneous composition, a smooth surface, and a resistivity of 6 microohms.cm which resistivity was approximately equal to a bulk resistivity of molybdenum.

Figure 3:
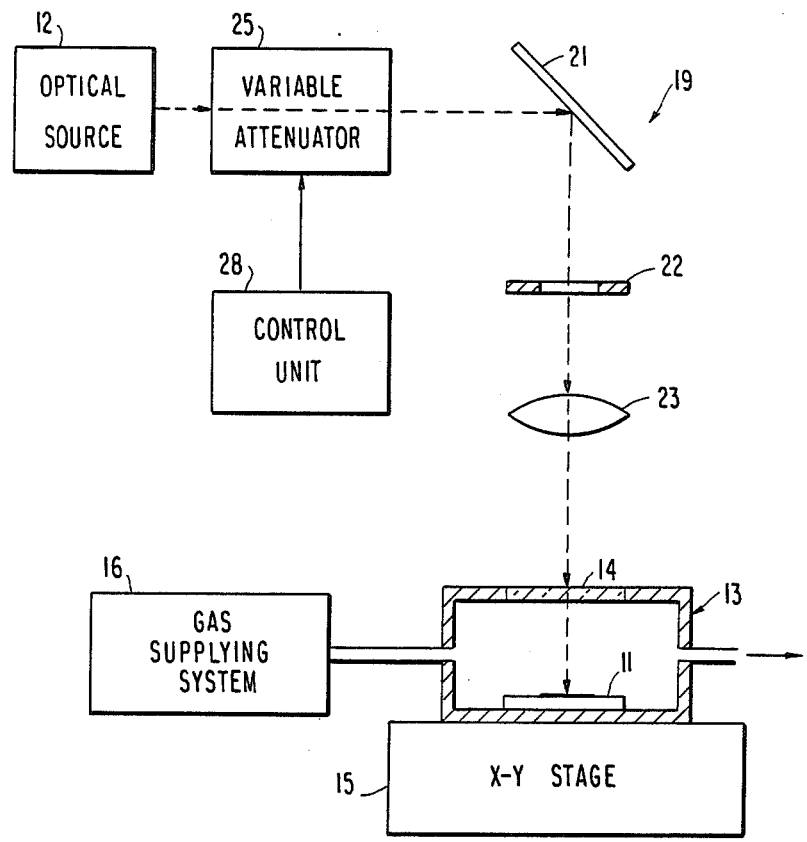
FIG. 3 is a schematic side view of an optical CVD device according to a third embodiment of this invention.

Referring to FIG. 3, an optical CVD device has a structure according to a third embodiment of the aforementioned one aspect of this invention and is for use in carrying out an optical CVD method according to a third embodiment of the other aspect of this invention. The substrate is again indicated at 11. Except for the temperature monitoring unit 27 (FIGS. 1 and 2), the device comprises similar parts which are designated once more by like reference numerals.

In connection with the device illustrated in FIG. 3, it should be pointed out that measurement of the peak temperature of the CVD film becomes complicated and therefore difficult when the predetermined area becomes narrow to have a linear dimension of only several microns or narrower. The temperature monitoring unit 27 is therefore omitted. Instead, a reference waveform generator is used as the control unit 28.

Figure 4:
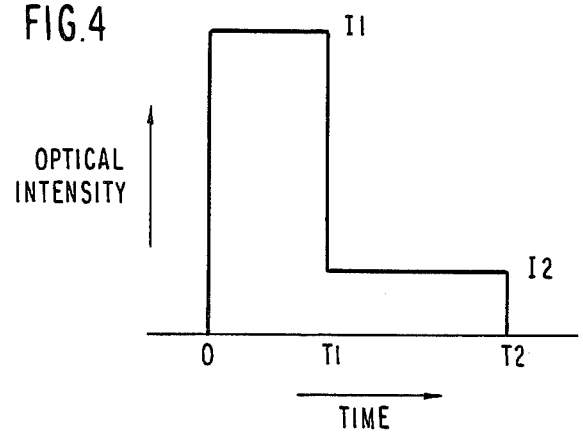
FIG. 4 shows a controlled optical intensity of a pulsed optical beam used in the device depicted in FIG. 3.

Turning to FIG. 4, the control unit 28 produces a stepped waveform on starting deposition of the CVD film and then throughout the deposition. The stepped waveform is for use in controlling the controllable attenuation of the variable optical attenuator 25 in two steps. In a first step, namely, during an initial interval of T1 seconds after start of deposition of the CVD film, the controllable attenuation gives a first intensity I1 to the attenuated intensity of the attenuated beam. In a second step which follows the first step, the attenuated intensity is rendered equal to a second intensity I2. The deposition is continued during a total interval T2 seconds until the CVD film is deposited to a desired thickness.

The second intensity I2 should be equal to an optical intensity, such as 2.0 MW/ cm$^2$ at the predetermined area, which is ordinarily used in depositing the CVD film and is known in the art. The first intensity I1 should be higher than the second intensity I2 so as to be effective in raising adhesion of the CVD film to the substrate 11. It goes without saying that the first intensity I1 should not be stronger than the threshold intensity of causing damages to the substrate 11.

Tests were carried out with the first and the second intensities I1 and I2 and the initial and the total intervals T1 and T2 used as parameters. The pulse repetition rate was 2 kHz. Each predetermined area was 10 microns by 10 microns wide. Chromium films were deposited on quartz substrates. The second intensity I2 was set at an optical intensity of 2.0 MW/ cm$^2$, which intensity was weaker than the threshold intensity of 3 MW/ cm$^2$.

When the first intensity I1 was 5 MW/ cm$^2$ or higher and the initial interval T1 was 2 seconds or longer, it was confirmed that the CVD film tenaciously adhered to the substrate so that no change was observed in the CVD film by scratch tests carried out by a pair of tweezers. When the first step was omitted, the adhesion was very poor. The poor adhesion was dependent on preliminarily cleaning of the substrates before start of the deposition. More specifically, the CVD films readily pealed off the substrates when no cleaning was preliminarily carried out. When the substrates were preliminarily cleaned, the CVD films partly pealed off when scratch tests were carried out by a pair of tweezers. This shows that use of the first step is useful not only in cleaning the substrates.

The total interval T2 was varied up to 12 seconds with the first step carried out. No change was observed as regards the adhesion. This shows that the first step is important in augmenting the adhesion.

When the first intensity I1 was used throughout the total interval T2 without the second step, evaporation was observed at a portion of each CVD film which was deposited during the initial interval T1 to a uniform thickness with a depthwise homogeneous composition and with a smooth surface. This shows that the first and the second steps are important in achieving an excellent film quality and an excellent surface morphology.

The device was actually used in depositing a relatively thin CVD film of a thickness of about 0.3 micron for use in reparing each photomask pinhole defect. The CVD film had not a rough surface which would otherwise result from an increase in the heat capacity and a resulting decrease in the temperature of the CVD film being deposited. The slit 22 may be omitted when the optical system 19 defines the predetermined area on the substrate 11 without such a slit.

Reviewing FIGS. 3 and 4, the optical CVD device can readily be implemented by mere addition of the control unit 28 to a conventional optical CVD device. According to the embodiment being illustrated, the optical CVD device is quite simple in structure and very inexpensive and yet is capable of carrying out an optical CVD method with an excellent reproducibility and a high reliability.

While this invention has thus far been described in specific conjunction with a few preferred embodiments thereof, it will now be readily possible for one skilled in the art to carry this invention into effect in various other manners. For example, the method and the device are useful in depositing a semiconductor CVD film, a CVD film of an insulating material, and a metal CVD film other than the chromium and the molybdenum films if the photothermal effect plays an important role in achieving a tenacious adhesion of the CVD film to the substrate and a depthwise homogeneous composition. Even when the photothermal effect is unnecessary, the method and the device are useful if cleaning of the substrate surface before deposition of the CVD film is effective in raising the adhesion, the reproducibility, and the reliability. The pulsed optical beam may either be a pulsed visible-ray laser beam or a continuous-wave laser beam which is pulsed by a chopper. In FIG. 3, it is possible to use the control unit 28 in generating a more complicated reference waveform.

What is claimed is:

1. A method of depositing a thin film on a predetermined area of a substrate exposed to a gas susceptible of photochemical reaction, said method including the step of irradiating said area by a pulsed optical beam of an optical intensity, wherein the improvement comprises the step of controlling said intensity during deposition of said film to a range determined by a thickness to which said film is deposited.

2. A method as claimed in claim 1, wherein said intensity is controlled so that said area has a peak temperature in a predetermined range.

3. A method as claimed in claim 1, wherein said intensity is controlled to be in a first intensity range and then in a second intensity range, said second intensity range being an intensity range which is ordinarily used in depositing said film, said first intensity range being higher than said second intensity range so as to be effective in raising adhesion of said film to said substrate.

4. A method as claimed in claim 3, wherein said intensity is controlled to be in a third intensity range after a peak temperature of the film being deposited begins to fall, said third intensity range being higher than said second intensity range.

5. In a device for use in depositing a thin film on a predetermined area of a substrate, said device including a reaction cell having a window and comprising means for holding said substrate, an optical source of a pulsed optical beam, an optical system for leading said optical beam to said predetermined area through said window, a gas supplying system for supplying a gas into said reaction cell to place said substrate in an atmosphere of said gas, said gas being susceptible of photochemical reaction when irradiated by said optical beam, the improvement wherein said optical system comprises a variable optical attenuator for giving a controllable attenuation to said optical beam so that an attenuated beam of an attenuated intensity be led to said predetermined area and that said gas be irradiated by said attenuated beam, said device comprising a control unit for controlling said controllable attenuation during deposition of said film to a range determined by a thickness to which said film is deposited.

6. A device as claimed in claim 5, wherein said control unit comprises a temperature monitoring unit for monitoring a temperature of said film during deposition of said film to produce an output signal representative of said temperature, a peak detecting circuit for detecting a peak value of said output signal to produce a peak signal representative of said peak value, a difference calculator responsive to said peak signal for calculating a difference between said peak value and a reference value, and means for controlling said controllable attenuation by said difference to said range.

7. A device as claimed in claim 6, wherein said attenuation controlling means is for controlling said controllable attenuation to keep said difference minimum.

8. A device as claimed in claim 5, wherein said control unit is for controlling said controllable attenuation so that said attenuated intensity be in a first intensity range and then in a second intensity range, said second intensity range being an intensity range which is ordinarily used in depositing said film, said first intensity range being higher than said second intensity range so as to be effective in raising adhesion of said film to said substrate.

9. A device as claimed in claim 8, wherein said control unit is for controlling said controllable attenuation so that said attenuated intensity be in a third intensity range after a peak temperature of the film being deposited begins to fall, said third intensity range being higher than said second intensity range.

* * * * *